US007511995B2

(12) United States Patent
Oowada

(10) Patent No.: US 7,511,995 B2
(45) Date of Patent: *Mar. 31, 2009

(54) SELF-BOOSTING SYSTEM WITH SUPPRESSION OF HIGH LATERAL ELECTRIC FIELDS

(75) Inventor: Ken Oowada, Kanagawa (JP)

(73) Assignee: SanDisk Corporation, Milpitas, CA (US)

(*) Notice: Subject to any disclaimer, the term of this patent is extended or adjusted under 35 U.S.C. 154(b) by 28 days.

This patent is subject to a terminal disclaimer.

(21) Appl. No.: 11/394,803

(22) Filed: Mar. 30, 2006

(65) Prior Publication Data

US 2007/0236993 A1 Oct. 11, 2007

(51) Int. Cl.
*G11C 11/34* (2006.01)
*G11C 16/04* (2006.01)

(52) U.S. Cl. .................. 365/185.02; 365/185.26; 365/185.17

(58) Field of Classification Search ........ 365/185.02 O, 365/185.26 X, 185.17 X, 185.02, 185.26, 365/185.17
See application file for complete search history.

(56) References Cited

U.S. PATENT DOCUMENTS

| 5,043,940 A | 8/1991 | Harari |
| 5,172,338 A | 12/1992 | Mehrotra et al. |
| 5,570,315 A | 10/1996 | Tanaka et al. |
| 5,621,684 A | 4/1997 | Jung |
| 5,677,873 A | 10/1997 | Choi et al. |
| 5,715,194 A | 2/1998 | Hu |
| 5,745,412 A | 4/1998 | Choi |
| 5,774,397 A | 6/1998 | Endoh et al. |
| 5,793,677 A | 8/1998 | Hu et al. |
| 5,887,145 A | 3/1999 | Harari et al. |
| 5,969,985 A | 10/1999 | Tanaka et al. |
| 5,991,202 A | 11/1999 | Derhacobian et al. |
| 6,044,013 A | 3/2000 | Tanaka et al. |
| 6,046,935 A | 4/2000 | Takeuchi et al. |
| 6,061,270 A | 5/2000 | Choi |
| 6,107,658 A | 8/2000 | Itoh et al. |
| 6,154,391 A | 11/2000 | Takeuchi et al. |
| 6,191,975 B1 | 2/2001 | Shimizu et al. |

(Continued)

FOREIGN PATENT DOCUMENTS

DE  10 2005 057553 A  10/2006

(Continued)

OTHER PUBLICATIONS

"U. S. Office Action" corresponding to U.S. Appl. No. 11/394,460 mailed on Dec. 12, 2007, 12 pgs.

(Continued)

*Primary Examiner*—VanThu Nguyen
(74) *Attorney, Agent, or Firm*—Davis Wright Tremaine LLP

(57) ABSTRACT

In an improved EASB programming scheme for a flash device (e.g. a NAND flash device), the number of word lines separating a selected word line (to which a program voltage is applied) and an isolation word line (to which an isolation voltage is applied) is adjusted as a function (e.g. inverse function) of distance of the selected word line from the drain side select gate to reduce program disturb due to high vertical and lateral electric fields at or near the isolation transistor when programming word lines closer to the drain side select gate. The selected and isolation word lines are preferably separated by two or more word lines to which intermediate voltage(s) are applied.

18 Claims, 9 Drawing Sheets

| | WL0 | WL1 | WL2 | WL3 | WL4 | WL5 | WL6 | WL7 | WL8 | WL9 | WL10 | WL11 | WL12 | WL13 | WL14 | WL15 |
|---|---|---|---|---|---|---|---|---|---|---|---|---|---|---|---|---|
| WL0 | Vpgm | | | | | | | Vpass | | | | | | | | |
| WL1 | Vlow | Vpgm | | | | | | Vpass | | | | | | | | |
| WL2 | Viso | Vlow | Vpgm | | | | | Vpass | | | | | | | | |
| WL3 | Vpass | Viso | Vlow | Vpgm | | | | Vpass | | | | | | | | |
| WL4 | Vpass | | Viso | Vlow | Vpgm | | | Vpass | | | | | | | | |
| WL5 | Vpass | | | Viso | Vlow | Vpgm | | | Vpass | | | | | | | |
| WL6 | Vpass | | | | Viso | Vlow | Vpgm | | | Vpass | | | | | | |
| WL7 | Vpass | | | | | Viso | Vlow | Vpgm | | | Vpass | | | | | |
| WL8 | Vpass | | | | | | Viso | Vlow | Vpgm | | | Vpass | | | | |
| WL9 | Vpass | | | | | | | Viso | Vlow | Vpgm | | | Vpass | | | |
| WL10 | Vpass | | | | | | | | Viso | Vlow | Vpgm | | | Vpass | | |
| WL11 | Vpass | | | | | | | | | Viso | Vlow | Vpgm | | | Vpass | |
| WL12 | Vpass | | | | | | | | | Viso | Vlow | Vpass | Vpgm | | Vpass | |
| WL13 | Vpass | | | | | | | | | Viso | Vlow | Vpass | | Vpgm | Vpass | |
| WL14 | Vpass | | | | | | | | | Viso | Vlow | Vpass | | | Vpgm | Vpass |
| WL15 | Vpass | | | | | | | | | Viso | Vlow | Vpass | | | | Vpgm |

Source Side / Applied Voltages for each Wordline / Drain Side
102 — Selected Wordline for Programming

U.S. PATENT DOCUMENTS

| | | |
|---|---|---|
| 6,282,117 B1 | 8/2001 | Tanaka et al. |
| 6,295,227 B1 | 9/2001 | Sakui et al. |
| 6,363,010 B2 | 3/2002 | Tanaka et al. |
| 6,455,889 B2 | 9/2002 | Sakui |
| 6,456,528 B1 | 9/2002 | Chen |
| 6,493,265 B2 | 12/2002 | Satoh et al. |
| 6,512,262 B2 | 1/2003 | Watanabe |
| 6,522,580 B2 | 2/2003 | Chen et al. |
| 6,525,964 B2 | 2/2003 | Tanaka et al. |
| 6,535,424 B2 | 3/2003 | Le et al. |
| 6,545,909 B2 | 4/2003 | Tanaka et al. |
| 6,614,688 B2 | 9/2003 | Jeong et al. |
| 6,643,188 B2 | 11/2003 | Tanaka et al. |
| 6,700,815 B2 | 3/2004 | Le et al. |
| 6,717,838 B2 | 4/2004 | Hosoi |
| 6,717,861 B2 | 4/2004 | Jeong et al. |
| 6,804,150 B2 | 10/2004 | Park et al. |
| 6,859,394 B2 | 2/2005 | Matsunaga et al. |
| 6,859,395 B2 | 2/2005 | Matsunaga et al. |
| 6,859,397 B2 | 2/2005 | Lutze et al. |
| 6,882,577 B2 | 4/2005 | Chiu et al. |
| 6,898,126 B1 | 5/2005 | Yang et al. |
| 6,930,921 B2 | 8/2005 | Matsunaga et al. |
| 6,975,018 B2 | 12/2005 | Ohmi et al. |
| 6,987,694 B2 | 1/2006 | Lee |
| 7,088,621 B2 | 8/2006 | Guterman et al. |
| 7,092,294 B2 | 8/2006 | Sato et al. |
| 7,161,833 B2 | 1/2007 | Hemink |
| 7,170,973 B2 | 1/2007 | Gipp et al. |
| 2001/0001491 A1 | 5/2001 | Sakui |
| 2001/0045585 A1 | 11/2001 | Watanabe |
| 2002/0110019 A1 | 8/2002 | Satoh et al. |
| 2002/0118569 A1 | 8/2002 | Jeong et al. |
| 2003/0048662 A1 | 3/2003 | Park et al. |
| 2004/0080980 A1 | 4/2004 | Lee |
| 2005/0047210 A1 | 3/2005 | Matsunaga et al. |
| 2005/0056869 A1 | 3/2005 | Ichige et al. |
| 2005/0157549 A1 | 7/2005 | Mokhlesi et al. |
| 2005/0174852 A1 | 8/2005 | Hemink |
| 2005/0226055 A1 | 10/2005 | Guterman |
| 2006/0028868 A1 | 2/2006 | Okazaki et al. |
| 2006/0092703 A1 | 5/2006 | Chae et al. |
| 2006/0133149 A1 | 6/2006 | Chae et al. |
| 2006/0198195 A1 | 9/2006 | Hemink et al. |
| 2006/0227613 A1 | 10/2006 | Joo |
| 2007/0019474 A1 | 1/2007 | Kim et al. |
| 2007/0047314 A1 | 3/2007 | Goda et al. |
| 2007/0081384 A1 | 4/2007 | Hemink |
| 2007/0236992 A1 | 10/2007 | Oowada |
| 2007/0236993 A1 | 10/2007 | Oowada |

FOREIGN PATENT DOCUMENTS

| | | |
|---|---|---|
| EP | 0 701 259 A2 | 3/1996 |
| JP | 09-082922 | 3/1997 |
| TW | 520507 B | 2/2003 |
| TW | 563136 B | 11/2003 |
| TW | 200306585 | 11/2003 |
| TW | 569221 B | 1/2004 |
| WO | WO 97/49089 | 12/1997 |
| WO | WO 2006/124525 | 11/2006 |
| WO | WO 2007/078793 | 7/2007 |
| WO | WO 2007/089370 A2 | 8/2007 |
| WO | WO 2007/117869 A2 | 10/2007 |

OTHER PUBLICATIONS

Oowada, "Self-Boosting Method with Suppression of High Lateral Electric Fields", U.S. Appl. No. 11/394,460, filed Mar. 30, 2006, 41 pages.

Pham et al., "Methods for Active Boosting to Minimize Capacitive Coupling Effect Between Adjacent Gates of Flash Memory Devices", U.S. Appl. No. 11/319,260, filed Dec. 27, 2005, 41 pages.

Pham et al., "Active Boosting to Minimize Capacitive Coupling Effect Between Adjacent Gates of Flash Memory Devices", U.S. Appl. No. 11/319,908, filed Dec. 27, 2005, 40 pages.

USPTO, "Office Action," mailed in related U.S. Appl. No. 11/394,460 on Apr. 12, 2007, 14 pages.

Aritome et al., "Reliability Issues of Flash Memory Cells", Proceedings of the IEEE, New York, vol. 81, No. 5, May 1, 1993, pp. 776-788.

Brown et al., Editors, "Nonvolatile Semiconductor Memory Technology, A Comprehensive Guide to Understanding and Using NVSM Devices", IEEE Press Series on Microelectronic Systems, (1998), 57 pages.

Cho et al., "A Dual Mode NAND Flash Memory: 1-Gb Multilevel and High-Performance 512-Mb Single-Level Modes", IEEE Journal of Solid-State Circuits, vol. 36, No. 11, Nov. 2001, 9 pages.

Choi et al., "A Novel Booster Plate Technology in High Density NAND Flash Memories for Voltage Scaling Down and Zero Program Disturbance", 1996 Symposium on VLSI Technology Digest of Technical Papers, 0-7803-3342-X/96/IEEE, 4 pages.

Jung et al., "A 3.3V 128Mb Multi-Level NAND Flash Memory for Mass Storage Applications", Samsung Electronics Co., Ltd., Kheung, Korea, 1 page.

Jung et al., "A 3.3-V Single Power Supply 16-Mb Nonvolatile Virtual DRAM Using a NAND Flash Memory Technology", IEEE Journal of Solid-State Circuits, vol. 32, No. 11, Nov. 1997, 12 pages.

Jung et al., "A 117-mm$^2$ 3.3-V Only 128-Mb Multilevel NAND Flash Memory for Mass Storage Applications," IEEE Journal of Solid-State Circuits, vol. 31, No. 11, Nov. 1996, 10 pages.

Kim et al., "Fast Parallel Programming of Multi-Level NAND Flash Memory Cells Using the Booster-Line Technology", Symposium on VLSI Technology Digest of Technical Papers, (1997), 2 pages.

Notification of Transmittal of the International Search Report and the Written Opinion of the International Searching Authority, or the Declaration, issued in corresponding PCT/US2005/001962, mailed Aug. 16, 2005, 15 pages.

Nozaki et al., "A 1-Mb EEPROM with MONOS Memory Cell for Semiconductor Disk Application", IEEE Journal of Solid-State Circuits, vol. 26, No. 4, Apr. 1991, 5 pages.

Satoh et al., "A Novel Gate-Offset NAND Cell (GOC-NAND) Technology Suitable for High-Density and Low-Voltage Operation Flash Memories", IEDM Technical Digest, Dec. 1999, 6 pages.

Suh et al., "A 3.3 V 32 Mb NAND Flash Memory with Incremental Step Pulse Programming Scheme", IEEE Journal of Solid-State Circuits, vol. 30, No. 11, Nov. 1995, 8 pages.

EPO/ISA, "Invitation to Pay Additional Fees," mailed in related PCT Application No. PCT/US2007/064215 on Aug. 16, 2007, 8 pages.

USPTO, "Notice of Allowance and Fee(s) Due," mailed in related U.S. Appl. No. 11/394,460 on Aug. 23, 2007, 6 pages.

EPO/ISA, "Notification of Transmittal of the International Search Report and Written Opinion of the International Searching Authority, or the Declaration,", mailed in related PCT Application No. PCT/US2007/064215 on Oct. 10, 2007, 18 pages.

EPO/ISA, "Invitation to Pay Additional Fees," mailed in related PCT Application No. PCT/US2007/064215 on Aug. 16, 2007, 8 pages.

USPTO, "Notice of Allowance and Fee(s) Due," mailed in related U.S. Appl. No. 11/394,460 on Aug. 23, 2007, 6 pages.

EPO/ISA, "Notification of Transmittal of the International Search Report and Written Opinion of the International Searching Authority, or the Declaration,", mailed in related PCT Application No. PCT/US2007/064215 on Oct. 10, 2007, 18 pages.

USPTO, "Notice of Allowance and Fee(s) Due," corresponding U.S. Appl. No. 11/394,460, mailed on May 12, 2008, 12 pages.

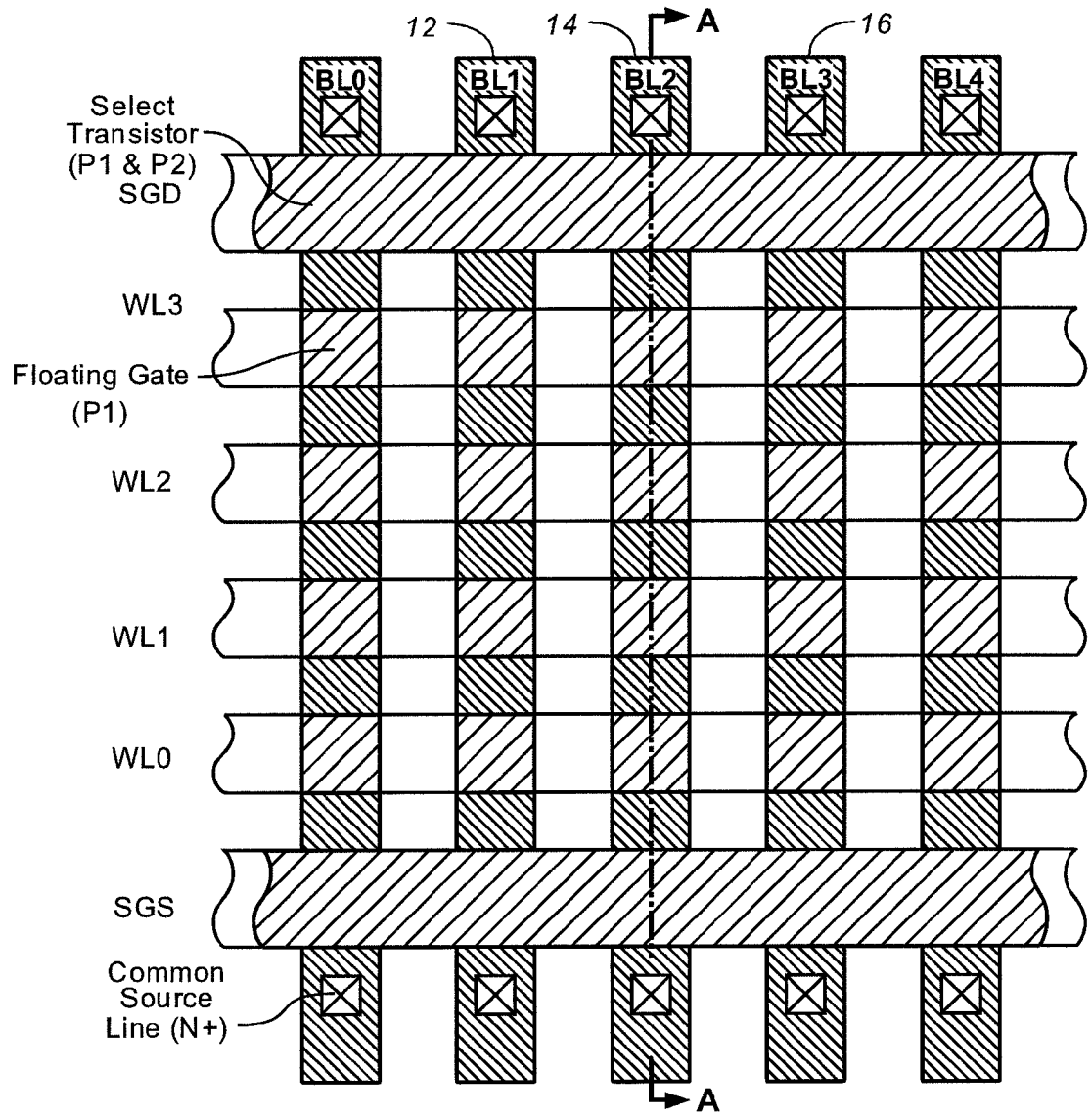
FIG. 2A *(PRIOR ART)*

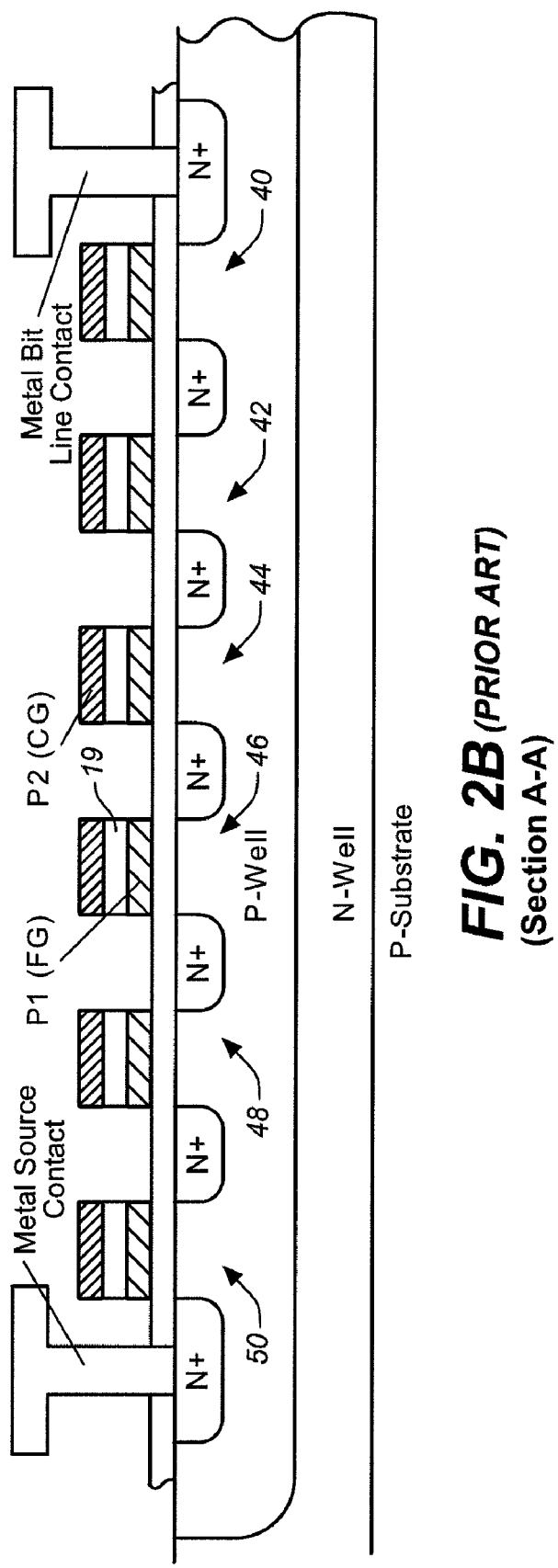
FIG. 2B *(PRIOR ART)*
(Section A-A)

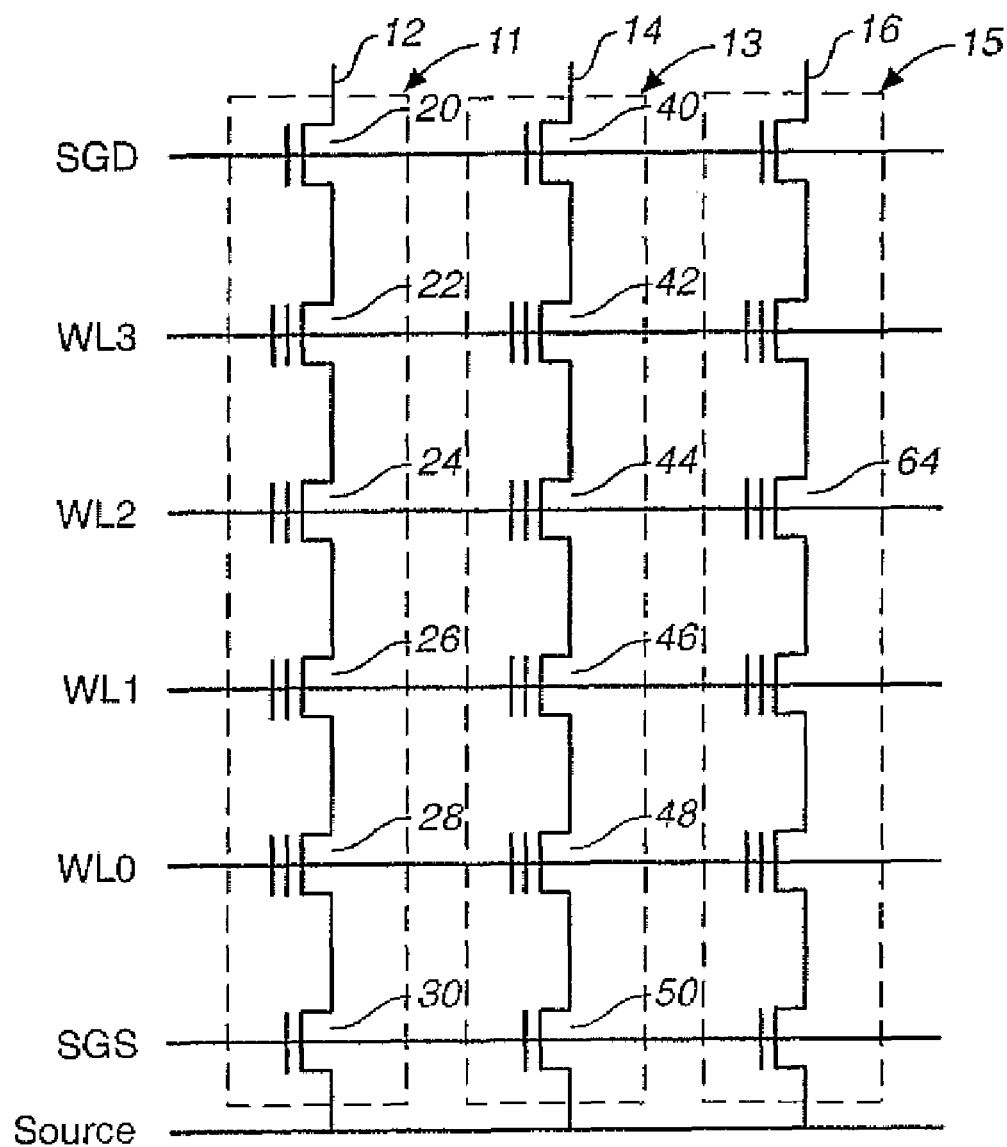
FIG._3A
(Prior Art)

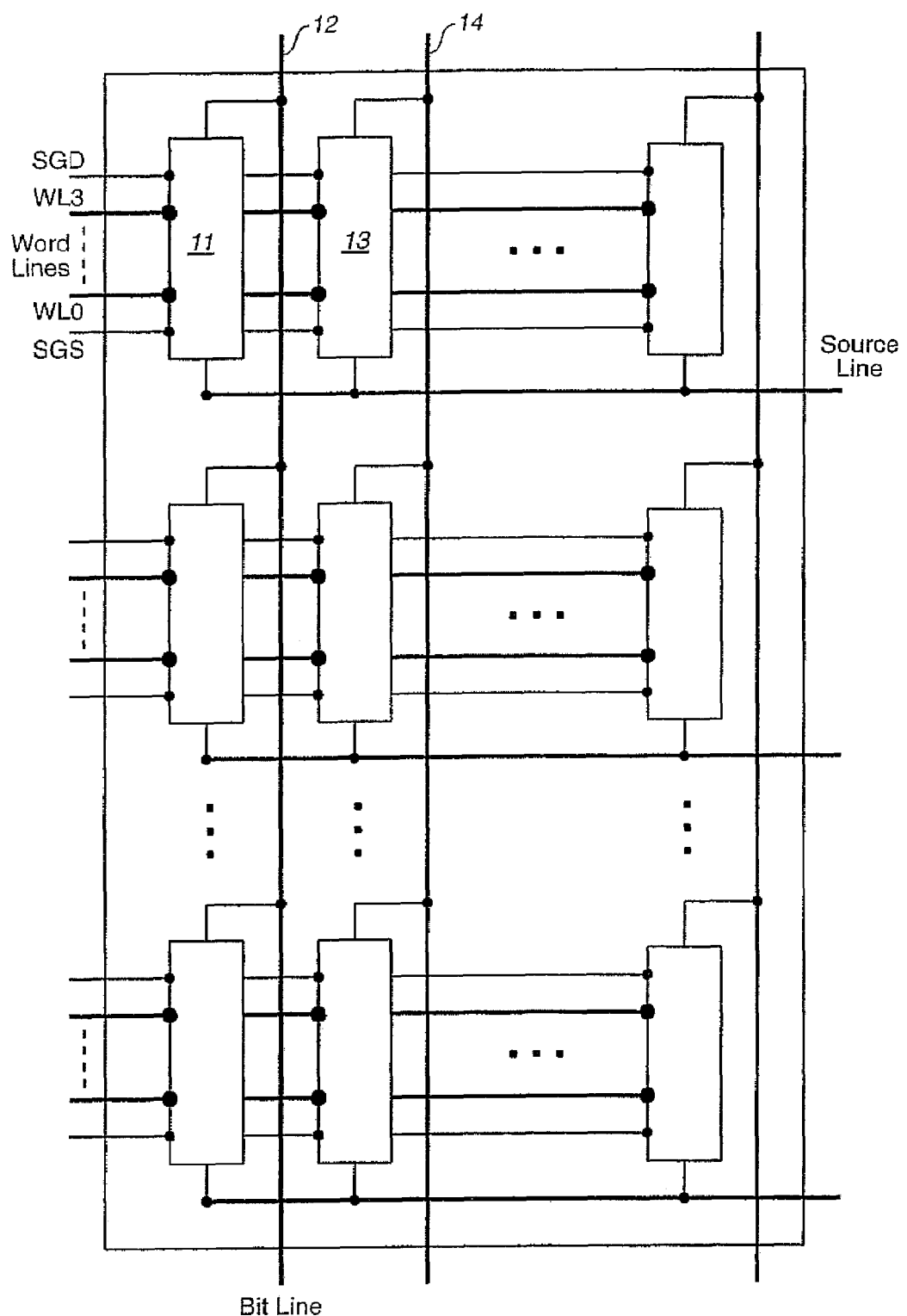
FIG._3B
(Prior Art)

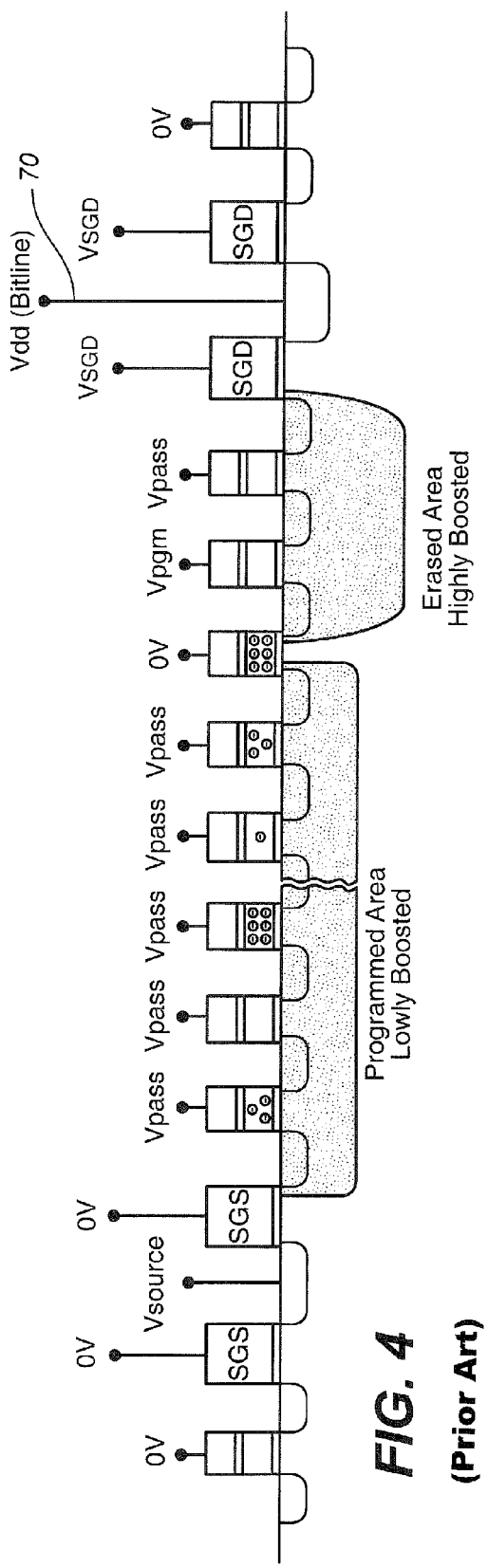
FIG. 4
(Prior Art)
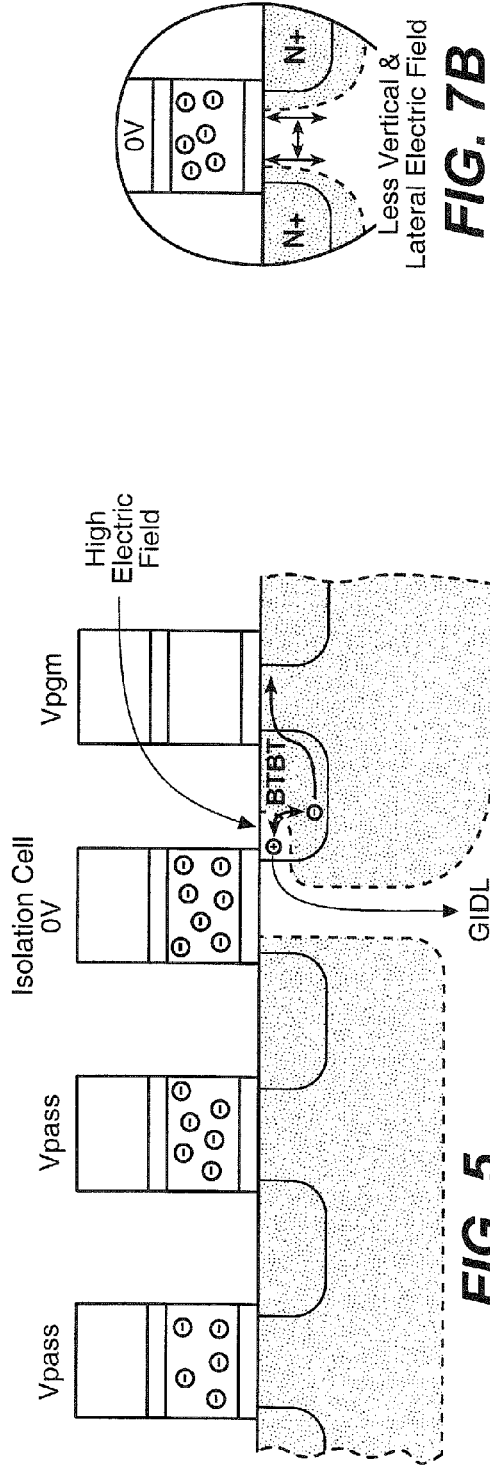
FIG. 7B
FIG. 5
(Prior Art)

FIG. 8

Applied Voltages for each Wordline

| | Source Side WL0 | WL1 | WL2 | WL3 | WL4 | WL5 | WL6 | WL7 | WL8 | WL9 | WL10 | WL11 | WL12 | WL13 | WL14 | Drain Side WL15 |
|---|---|---|---|---|---|---|---|---|---|---|---|---|---|---|---|---|
| WL0 | Vpgm | Vlow | Viso | Vpass | Vpass | Vpass | Vpass | Vpass | Vpass | Vpass | Vpass | Vpass | Vpass | Vpass | Vpass | Vpass |
| WL1 | Vlow | Vpgm | Vlow | Viso | Vpass | Vpass | Vpass | Vpass | Vpass | Vpass | Vpass | Vpass | Vpass | Vpass | Vpass | Vpass |
| WL2 | Viso | Vlow | Vpgm | Vlow | Viso | Vpass | Vpass | Vpass | Vpass | Vpass | Vpass | Vpass | Vpass | Vpass | Vpass | Vpass |
| WL3 | Vpass | Viso | Vlow | Vpgm | Vlow | Viso | Vpass | Vpass | Vpass | Vpass | Vpass | Vpass | Vpass | Vpass | Vpass | Vpass |
| WL4 | Vpass | Vpass | Viso | Vlow | Vpgm | Vlow | Viso | Vpass | Vpass | Vpass | Vpass | Vpass | Vpass | Vpass | Vpass | Vpass |
| WL5 | Vpass | Vpass | Vpass | Viso | Vlow | Vpgm | Vlow | Viso | Vpass | Vpass | Vpass | Vpass | Vpass | Vpass | Vpass | Vpass |
| WL6 | Vpass | Vpass | Vpass | Vpass | Viso | Vlow | Vpgm | Vlow | Viso | Vpass | Vpass | Vpass | Vpass | Vpass | Vpass | Vpass |
| WL7 | Vpass | Vpass | Vpass | Vpass | Vpass | Viso | Vlow | Vpgm | Vlow | Viso | Vpass | Vpass | Vpass | Vpass | Vpass | Vpass |
| WL8 | Vpass | Vpass | Vpass | Vpass | Vpass | Vpass | Viso | Vlow | Vpgm | Vlow | Viso | Vpass | Vpass | Vpass | Vpass | Vpass |
| WL9 | Vpass | Vpass | Vpass | Vpass | Vpass | Vpass | Vpass | Viso | Vlow | Vpgm | Vlow | Viso | Vpass | Vpass | Vpass | Vpass |
| WL10 | Vpass | Vpass | Vpass | Vpass | Vpass | Vpass | Vpass | Vpass | Viso | Vlow | Vpgm | Vlow | Viso | Vpass | Vpass | Vpass |
| WL11 | Vpass | Vpass | Vpass | Vpass | Vpass | Vpass | Vpass | Vpass | Vpass | Viso | Vlow | Vpgm | Vlow | Viso | Vpass | Vpass |
| WL12 | Vpass | Vpass | Vpass | Vpass | Vpass | Vpass | Vpass | Vpass | Vpass | Vpass | Viso | Vlow | Vpgm | Vlow | Viso | Vpass |
| WL13 | Vpass | Vpass | Vpass | Vpass | Vpass | Vpass | Vpass | Vpass | Vpass | Vpass | Vpass | Viso | Vlow | Vpgm | Vlow | Viso |
| WL14 | Vpass | Vpass | Vpass | Vpass | Vpass | Vpass | Vpass | Vpass | Vpass | Vpass | Vpass | Vpass | Viso | Vlow | Vpgm | Vlow |
| WL15 | Vpass | Vpass | Vpass | Vpass | Vpass | Vpass | Vpass | Vpass | Vpass | Vpass | Vpass | Vpass | Vpass | Viso | Vlow | Vpgm |

102 — Selected Wordline for Programming

| | WL0 | WL1 | WL2 | WL3 | WL4 | WL5 | WL6 | WL7 | WL8 | WL9 | WL10 | WL11 | WL12 | WL13 | WL14 | WL15 |
|---|---|---|---|---|---|---|---|---|---|---|---|---|---|---|---|---|
| WL0 | Vpgm | Vlow | Viso | Vpass | Vpass | Vpass | Vpass | Vpass | Vpass | Vpass | Vpass | Vpass | Vpass | Vpass | Vpass | Vpass |
| WL1 | Vlow | Vpgm | Vlow | Viso | Vpass | | | | | | | | | | | |
| WL2 | Viso | Vlow | Vpgm | Vlow | Viso | Vpass | | | | | | | | | | |
| WL3 | Vpass | Viso | Vlow | Vpgm | Vlow | Viso | Vpass | | | | | | | | | |
| WL4 | Vpass | Vpass | Viso | Vlow | Vpgm | Vlow | Viso | Vpass | | | | | | | | |
| WL5 | | Vpass | Vpass | Viso | Vlow | Vpgm | Vlow | Viso | Vpass | | | | | | | |
| WL6 | | | Vpass | Vpass | Viso | Vlow | Vpgm | Vlow | Viso | Vpass | | | | | | |
| WL7 | | | | Vpass | Vpass | Viso | Vlow | Vpgm | Vhi1 | Vpass | Vpass | | | | | |
| WL8 | | | | | Vpass | Viso | Viso | Vhi1 | Vpgm | Vhi2 | Vpass | Vpass | | | | |
| WL9 | | | | | Vpass | Viso | Viso | Vlow | Vhi2 | Vpgm | Vhi3 | Vpass | Vpass | | | |
| WL10 | | | | | | Vpass | Viso | Vlow | Vlow | Vhi3 | Vpgm | Vhi4 | Vpass | Vpass | | |
| WL11 | | | | | | | Vpass | Viso | Vlow | Vlow | Vhi4 | Vpgm | Vhi5 | Vpass | Vpass | |
| WL12 | | | | | | | | Vpass | Viso | Vlow | Vlow | Vhi3 | Vpgm | Vhi4 | Vpass | Vpass |
| WL13 | | | | | | | | | Vpass | Viso | Vlow | Vlow | Vhi3 | Vpgm | Vhi4 | Vpass |
| WL14 | | | | | | | | | | Vpass | Vpass | Viso | Vlow | Vlow | Vpgm | Vpass |
| WL15 | | | | | | | | | | | Vpass | Vpass | Viso | Vlow | Vlow | Vpgm |

FIG. 9

SELF-BOOSTING SYSTEM WITH SUPPRESSION OF HIGH LATERAL ELECTRIC FIELDS

CROSS-REFERENCE TO RELATED APPLICATION

This application is related to U.S. patent application Ser. No. 11/394,460, entitled, "Self-Boosting Method with Suppression of High Lateral Electric Fields", issued as U.S. Pat. No. 7,428,165, filed on the same day as the present application; which application is incorporated in its entirety by reference as if fully set forth herein.

BACKGROUND OF THE INVENTION

This invention relates generally to non-volatile semiconductor memories of the flash EEPROM (Electrically Erasable and Programmable Read Only Memory) type, particularly to structures and methods of operating NAND types of memory cell arrays.

There are many commercially successful non-volatile memory products being used today, particularly in the form of small form factor cards, which use an array of flash EEPROM cells.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 (of which BL1-BL3 for transistor strings, such as NAND strings 11, 13, 15 in FIG. 3A, are also labeled 12, 14, 16) represent diffused bit line connections to global vertical metal bit lines (not shown). Although four floating gate memory cells are shown in each string, the individual strings typically include 16, 32 or more memory cell or charge storage elements, such as floating gates, in a column. The terms "memory cell" and "charge storage element" are used interchangeably herein. Control gate (word) lines labeled WL0-WL3 in FIG. 2A (labeled P2 in FIG. 2B, a cross-sectional along line A-A of FIG. 2A) and string selection lines SGD and SGS extend across multiple strings over rows of floating gates, often in polysilicon (labeled P1 in FIG. 2B). However, for drain side select transistor 40 and source side select transistor 50, the control gate and floating gate may be electrically connected (not shown), which are referred to below as the drain side select gate (for transistor 40), and source side select gate (for transistor 50). The control gate lines (CG) are typically formed over the floating gates as a self-aligned stack, and are capacitively coupled with each other through an intermediate dielectric layer 19, as shown in FIG. 2B. The top and bottom of the string connect to the bit line and a common source line respectively, commonly through a transistor using the floating gate material (P1) as its active gate electrically driven from the periphery. This capacitive coupling between the floating gate (FG) and the control gate (CG) of each of the four transistors in each string allows the voltage of the floating gate to be raised by increasing the voltage on the control gate coupled thereto. An individual cell within a column or string is read and verified during programming by causing the remaining cells in the string to be turned on by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

Relevant examples of NAND type flash memories and their operation are provided in the following U.S. patents/patent Applications, all of which are incorporated herein by reference: U.S. Pat. Nos. 5,570,315; 5,774,397; 6,046,935, 6,456,528 and 6,522,580.

The charge storage elements of current flash EEPROM arrays are most commonly electrically conductive floating gates, typically formed from doped polysilicon material. However, other materials with charge storing capabilities, that are not necessarily electrically conductive, can be used as well. An example of such an alternative material is silicon nitride. Such a cell is described in an article by Takaaki Nozaki et al., "A 1-Mb EEPROM with MONOS Memory Cell for Semiconductor Disk Application" IEEE Journal of Solid-State Circuits, Vol. 26, No. 4, April 1991, pp. 497-501.

Memory cells of a typical non-volatile flash array are divided into discrete blocks of cells that are erased together. That is, the block contains the minimum number of cells that are separately erasable together as an erase unit, although more than one block may be erased in a single erasing operation. Each block typically stores one or more pages of data, a page defined as the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As in most all integrated circuit applications, the pressure to shrink the silicon substrate area required to implement some integrated circuit function also exists with flash EEPROM arrays. It is continually desired to increase the amount of digital data that can be stored in a given area of a silicon substrate, in order to increase the storage capacity of a given size memory card and other types of packages, or to both increase capacity and decrease size. Another way to increase the storage density of data is to store more than one bit of data per memory cell charge storage element. This is accomplished by dividing the allowable voltage or charge storage window of a charge storage element into more than two states. The use of four such states allows each cell to store two bits of data, eight states stores three bits of data per cell, and so on. A multiple state flash EEPROM structure and operating is described in U.S. Pat. Nos. 5,043,940; 5,172,338, 5,570,315 and 6,046,935.

A typical architecture for a flash memory system using a NAND structure will include NAND arrays, where each array includes several NAND strings. For example, FIG. 3A shows only three NAND strings 11, 13 and 15 of the memory array of FIG. 2A, which array contains more than three NAND strings. Each of the NAND strings of FIG. 3A includes two select transistors and four memory cells. For example, NAND string 11 includes select transistors 20 and 30, and memory cells 22, 24, 26 and 28. NAND string 13 includes select transistors 40 and 50, and memory cells 42, 44, 46 and 48. Each string is connected to the source line by its select transistor (e.g. select transistor 30 and select transistor 50). A selection line SGS is used to control the source side select gates. The various NAND strings are connected to respective bit lines by select transistors 20, 40, etc., which are controlled by select line SGD. In other embodiments, the select lines do not necessarily need to be in common. Word line WL3 is connected to the control gates for memory cell 22 and memory cell 42. Word line WL2 is connected to the control gates for memory cell 24 and memory cell 44. Word line WL1 is connected to the control gates for memory cell 26 and memory cell 46. Word line WL0 is connected to the control gates for memory cell 28 and memory cell 48. As can be seen, each bit line and the respective NAND string comprise the columns of the array of memory cells. The word lines (WL3, WL2, WL1 and WL0) comprise the rows of the array. Each word line connects the control gates of each memory cell in the row. For example, word line WL2 is connected to the control gates for memory cells 24, 44 and 64.

FIG. 3B is a circuit diagram depicting a number of NAND arrays, with each array controlled by a set of common word lines. The array of FIGS. 2A and 3 appears as the top array in FIG. 3B. As shown in FIG. 3B, each NAND string (e.g. 11, 13) in the same array is connected to one of a plurality of bit lines 12, 14, . . . and to a common source line, and are controlled by a common set of word lines (WL0-WL3).

Each memory cell can store data (analog or digital). When storing one bit of digital data (binary memory cell), the range of possible threshold voltages of the memory cell is divided into two ranges which are assigned logical data "1" and "0". In one example of a NAND type flash memory, the voltage threshold is negative after the memory cell is erased, and defined as logic "1." The threshold voltage after a program operation is positive and defined as logic "0." When the threshold voltage is negative and a read is attempted with 0 volt applied to its control gate, the memory cell will conduct current to indicate logic one is being stored. When the threshold voltage is positive and a read operation is attempted, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information are stored, there will be four threshold voltage ranges, each range assigned to one data value. Memories storing data by differentiation between multiple (i.e. more than two) ranges of threshold voltage are known as multiple state memories. In one example of a NAND type memory, the threshold voltage after an erase operation is negative and defined as "11". Positive threshold voltages are used for the states of "10", "01", and "00."

When programming a NAND flash memory cell, a program voltage is applied to the control gate and the channel area of the NAND string that is selected for programming is grounded (0V). Electrons from the channel area under the NAND string are injected into the floating gate. When electrons accumulate in the floating gate, the floating gate becomes negatively charged and the threshold voltage of the cell is raised. To ground the channel area of the selected NAND string, the corresponding bitline is grounded (0 volt), while the SGD is connected to a sufficiently high voltage (typically $V_{dd}$ at for example 3.3 volts) that is higher than the threshold voltage of the select transistors. To apply the program voltage to the control gate of the cell being programmed, that program voltage is applied on the appropriate word line. As discussed above, that word line is also connected to one cell in each of the other NAND strings that utilize the same word line. For example, when programming cell 24 of FIG. 3A, the program voltage will also be applied to the control gate of cell 44 because both cells share the same word line. A problem arises when it is desired to program one cell on a word line without programming other cells connected to the same word line, for example, when it is desired to program cell 24 and not cell 44. Because the program voltage is applied to all cells connected to a word line, an unselected cell (a cell that is not to be programmed) on the word line may become inadvertently programmed. For example, cell 44 is adjacent to cell 24. When programming cell 24, there is a concern that cell 44 might unintentionally be programmed. The unintentional programming of the unselected cell on the selected word line is referred to as "program disturb." More generally speaking, "program disturb" is used to describe any unwanted threshold voltage shift, either in the positive or negative direction, which can occur during a programming operation and is not necessarily limited to the selected word line.

Several techniques can be employed to prevent program disturb. One method known as "self boosting" ("SB") is proposed by K. D. Suh et al. in "A 3.3 V 32 Mb NAND Flash Memory with Incremental Step Pulse Programming Scheme," Journal of Solid-State Circuits, Vol 30, No. 11, November 1995, pp. 1149-55. During programming using the SB scheme, the channel areas of the unselected NAND strings are electrically isolated from their corresponding bit lines. Subsequently an intermediate pass voltage (e.g. 10 volts) is applied to the unselected word lines while a high program voltage (e.g. 18 volts) is applied to the selected word line. In this application, the terms "isolate" and "electrically isolate" are used interchangeably, and the terms "writing voltage," "program voltage" and "programming voltage" are used interchangeably. The channel areas of the unselected NAND strings are capacitively coupled to the unselected word lines, causing a voltage (e.g. six volts, assuming a coupling ratio of 0.6) to exist in the channel areas of the unselected NAND strings. This so called "Self Boosting" reduces the potential difference between the channel areas of the unselected NAND strings and the program voltage that is applied to the selected word line. As a result, for the memory cells in the unselected NAND strings and especially for the memory cells in such strings on the selected word line, the voltage across the tunnel oxide and hence the program disturb are significantly reduced.

Referring to FIG. 3A, when a self boosting program technique is applied to the memory array in FIG. 3A to program one of the cells on bit line 12, for example, zero volt is applied to the bit line 12 and voltage $V_{dd}$ (e.g. 3.3 volts) is applied to the bit line 14. The voltage $V_{dd}$ is applied to the drain select line SGD to turn on the transistors 20 and 40 and zero volt is applied to the source select line SGS to turn off transistors 30 and 50. Assuming that all of the memory cells in the array 42-48 are in the normally on states (e.g. erased or negative threshold voltage state), the channel potential of all the cells in the NAND string between transistors 40 and 50 is given by the difference between $V_{dd}$ applied to SGD and the threshold voltage of the select transistor 40. For example, if $V_{dd}$ is 3.3 volts and the threshold voltage of transistor 40 is 1.3 volts, then the channel potential of all the cells 42-48 is charged to 2 volts. The above operation can be referred to as "precharging" since the channel potential is pre-charged to a predefined potential of about 2V in this case. Since transistor 50 is turned off and transistor 40 will turn off automatically after the channel potential of the NAND string has reached a sufficiently high value (2V in this case) the channel potential of memory cells 42-48 becomes floating. Therefore, when the high program voltage Vpgm (e.g. 18 volts) is applied to the word line WL2, and an intermediate voltage Vpass (e.g. 10 volts) is applied to the remaining word lines, the channel potential of memory cells 42-48 is bootstrapped or boosted from 2 volts, the initial pre-charged level, to a value such as 8 volts, due to capacitive coupling, assuming a coupling ratio of about 0.6. Therefore, even though a high voltage such as 18 volts is applied to the control gate of memory cell 44, the potential difference between such high voltage and the channel potential is not adequate to cause electron tunneling through the oxide to the floating gate of memory cell 44, thereby preventing program disturb.

A NAND string is typically (but not always) programmed from the source side to the drain side, for example, from memory cell 28 to memory cell 22 in one programming cycle. When the programming process is ready to program the last (or near the last) memory cell of the NAND string, if all or most of the previously programmed cells on the string being inhibited (e.g. string 13) were programmed, then there is negative charge in the floating gates of the previously programmed cells. Because of this negative charge on the floating gates, the pre-charging can not take place completely, resulting in a lower initial potential of the channel area under the NAND string and the subsequent self-boosting of such channel area becomes less effective as well. Therefore, the boosted potential in the channels of the unselected NAND strings may not become high enough and there still may be program disturb on the last few word lines. For example, when programming voltage is applied to WL3, if cells 48, 46, and 44 on a string that is inhibited were programmed, then each of those memory cells 44, 46, 48 has a negative charge on its floating gate which will limit the boosting level of the self boosting process and possibly cause program disturb on cell 42.

In view of the above problem, as an improvement, a scheme known as erased area self boosting ("EASB") has been proposed. In the EASB scheme, when applying a high programming voltage to the word line WL2, in order to reduce or prevent program disturb in regard to memory cell 44 on a string that is inhibited, 0 volts is applied to word line WL1 so that memory cell 46 is turned off. Cell 46 then isolates the channel region of string 13 on the bit line side of cell 46 from the channel region of string 13 on the source line side of cell 46. In other words, the channel region of cells 42, 44 is isolated from the channel region of cell 48. Since cell 46 and 48 are more likely to have negative charges on their floating gates, whereas cells 42, 44 will not have negative charges on their floating gates, then the channel potential in memory cell 44 is not or at least less influenced by the potentially reduced self boosting in the channel regions of memory cells 46 and 48. Therefore, the channel potential of the channel region of memory cells 44 and 42 may be self boosted by the high programming voltage Vpgm and the passing voltage (e.g. at 10V) to a voltage level that is higher than that achieved when the channel region of memory cell 44 is influenced by the self boosting in the memory cells 46 and 48 as well as the self boosting in the memory cells 42 and 44. This prevents program disturb when memory cell 24 is being programmed.

FIG. 4 illustrates the typical EASB program inhibit operation. Vdd is applied to the Bitline 70, thus the NAND string is boosted and inhibited from programming. Erased Area Self Boosting is defined as applying sufficiently low voltage (in this case 0V) to the source side neighbor of the selected word line to which a program voltage Vpgm is applied in order to isolate the programmed and erased channel area. The shaded areas in FIGS. 4 and 5 illustrate the channel areas where electrical potentials or voltages have been boosted to high levels. However, as the memory cell dimensions scale down, program disturb becomes more severe even for the EASB method or variations thereof.

Phenomenon such as Gate Induced Drain Leakage (GIDL), Band-To-Band Tunneling (BTBT), punch through, or any other undesired phenomenon that causes program disturb are generally triggered by high vertical and lateral electric fields in or in between flash cells, and will become worse when memory cells are scaled down, since applied voltages used in flash memory cell can not be easily scaled down. This contradicting scaling limitation will trend to increase the electric fields as scaling proceeds. This is illustrated in FIG. 5. As shown in FIG. 5, BTBT and GIDL are common phenomena which are triggered by the high electric field (channel areas with high boosted electrical potentials shown as shaded areas in FIG. 5) at the isolation cell junction. When the isolation cell is programmed to a high threshold voltage and, or when boosted channel potential is high, the electric field at the isolation cell with 0V applied to the control gate will be larger. This enhances GIDL or any other phenomenon triggered by the high electric field resulting in program disturb.

As illustrated in FIG. 5, undesired carriers generated due to high electric fields will be injected in to the floating gate of the closest high potential path, typically the cell with relatively high voltage applied to the control gate. The combination of low voltage on the word line of the memory cell that isolates the two channel regions or areas, and the high boosted channel potential that results in a high drain potential on the isolation cell, can increase the electric field. The electric fields in or in between the memory cells strongly depend on the threshold voltage state and the applied voltage to the isolation cell. The vertical electric field at the isolation cell increases when programming cells closer to the drain side select gate. This is because when cells close to the drain select gate are being programmed, the erased channel region or area on the drain side of the isolation cell is small or very small. This means that the capacitance of the erased channel region or area on the drain side of the isolation cell is small, so that the boosting efficiency is high and the boosting effect of the high program voltage Vpgm is more strongly felt. Thus program disturb enhanced by the high electric fields in or in between memory cells is worse when programming the cells closer to the drain side select gate, and also becomes worse as the cell is scaled down.

It is therefore desirable to provide a programming scheme whereby the above described difficulties are alleviated or reduced.

SUMMARY OF THE INVENTION

As noted above, in conventional programming schemes such as EASB, high electric field enhanced program disturb characteristic is worse when programming the cells closer to the drain side select gate. This is because memory cells are in general programmed in a specified order with the cells closest to the source side select gate being programmed first, and sequentially programmed to the cells closest to the drain side select gate. In case of the EASB or any other versions thereof, the word lines to which all defined voltages including the isolation voltage are applied are kept at constant distances from the selected word line to which Vpgm is applied. In case of the EASB method, the low isolation voltage is applied to the word line (referred to herein below as "isolation word line") adjacent to and on the source side of the selected word line (referred to herein below as "selected word line") to which the program voltage Vpgm is applied. This EASB method will increase the probability of high electric field enhanced program disturb when a word line close to the drain side select gate is selected, as the erased area boosted isolated channel capacitance will be smaller when the selected word line is closer to drain side select gate, as explained above.

Since an isolation cell is immediately underneath a corresponding isolation word line, the distance between the isolation word line and another element (e.g. word line, bit or source line, drain or source select gate) also indicates the distance between the isolation cell and such element.

One aspect of this invention is based on the recognition that the above problem can be alleviated by separating the isolation word line from the selected word line by a larger distance when programming a word line closer to the drain side select gate than when programming a word line further away from such gate, as done in one embodiment. Typically separating the isolation word line from the selected word line by a larger distance means separating the isolation word line from the selected word line by a larger number of word line(s). Stated more generally, the programming is performed by adjusting (e.g. by increasing) the distance (or the number of word lines) between the isolation word line and the selected word line as a function of distance (or the number of word lines) between the selected word line and the drain side select gate when programming at least some (e.g. two or more) of the word lines. Preferably, the adjustment is such that the distance (or the number of word lines) between the isolation and selected word lines is an inverse function of the distance (or the number of word lines) between the selected word line and the bit line, whether or not the programming is sequential from cells close to the source line to cells close to the bit line.

For example, one implementation of the above embodiment adopts a programming sequence where memory cells are programmed in a specified order with the cells closest to the source side select gate being programmed first, and sequentially programmed to the cells closest to the drain side select gate in the programming cycle. In this implementation, during one time interval of the programming cycle, the low isolation voltage is applied to the isolation word line that is at a larger distance from the selected word line compared with the case during an earlier time interval of the programming cycle. In other words, the number of word lines separating the isolation cell and the selected word line can be increased as the programming progresses towards the drain select gate. The result is that the channel region or area on the drain side of the isolation cell will not be too small, so that its capacitance also will not be so small as to result in the excessive vertical and/or lateral electric fields caused by the application of the program voltage Vpgm.

The above aspect of the invention can suppress the excessive boosting that results in a high electrical field at the isolation word line cell junction, especially when a word line close to the drain side select gate is selected for programming. Also, program disturb can be minimized because the isolation word line can be physically further away from the selected word line. The above aspect of the invention can be combined with any type of boosting method that currently exists. For example, another boosting method, such as the conventional EASB method or variations thereof can be used up to a certain word line selected for programming, while position of the isolation word line can be fixed (i.e. isolation voltage applied to the same fixed word line) when word lines closer to the drain side select gate are selected subsequently for programming. Alternatively, the number of word lines separating the isolation word line and the selected word line can be increased continually or intermittently or in any other manner as the programming progresses towards the drain side select gate. In these embodiments, all the other word lines in between the isolation word line and the selected word line can be set at any voltages. But, these embodiments would be most effective if voltages high enough are chosen to keep the drain side NAND string conductive, but not too high to avoid enhancing the high electric field in or around the isolation word line. Where boosting may be inadequate as the programming progresses towards the drain side select gate, relatively higher voltage(s) may be applied to word lines in between the isolation word line and the selected word line.

The above aspect of the invention is not limited to a scheme where memory cells are programmed in a specified order with the cells closest to the source side select gate being programmed first, and sequentially programmed to the cells closest to the drain side select gate in the programming cycle. Even where sequential source to drain programming is not used, substantially the same advantages can be attained when the programming is such that it avoids the above described situation that results in high lateral electric fields exists, such as where the isolation cell is too close to the drain side select gate in any EASB type of programming scheme. Such high vertical and lateral electric fields can be reduced by increasing the separation between the isolation word line and the selected word line when programming one or more word lines close to the drain side select gate.

According to another aspect of the invention, the programming is such that the isolation word line and the selected word line can be separated by at least two word lines. This reduces the high vertical and lateral electric fields that would otherwise exist in EASB type programming methods and systems. In one embodiment, all the word lines in between the isolation word line and the selected word line can be set at any voltages. But, this embodiment would be most effective if voltages high enough are chosen to keep the drain side NAND string conductive, but not too high to avoid enhancing the high electric field in or around the isolation word line. Where boosting may be inadequate as the programming progresses towards the drain side select gate, relatively higher voltage(s) may be applied to word lines in between the isolation word line and the selected word line. This aspect of the invention can be combined with any type of boosting method that currently exists. For example, another boosting method, such as the conventional EASB method or variations thereof can be used up to a certain word line in an initial part of the programming cycle. Then the programming can be such that the isolation word line and the selected word line to which the program voltage is applied is separated by at least two word lines in the remainder of the programming cycle. This aspect of the invention is not limited to a scheme where memory cells are programmed in a specified order with the cells closest to the source side select gate being programmed first, and sequentially programmed to the cells closest to the drain side select gate in the programming cycle. This aspect of the invention can be combined with another aspect described above by adjusting the number (e.g. by increasing the number to two or more) of word lines between the isolation word line and the selected word line as a function of distance of the selected word line from the drain side select gate.

The various different features described above can be combined in many different combinations.

BRIEF DESCRIPTION OF THE DRAWINGS

FIG. 2A is a plan view of a prior art NAND array.

FIG. 2B is a cross-sectional view of the prior art NAND array of FIG. 2A taken along the line A-A.

FIG. 3A is a circuit diagram depicting three of the NAND strings of FIG. 2A.

FIG. 3B is a circuit diagram depicting a number of NAND arrays, with each array controlled by a set of common word lines.

FIG. 4 is a cross-sectional view of a NAND array, illustrating the conventional EASB program inhibit operation. Isolation word line is the source side neighbor of the selected Vpgm word line. Circles with negative signs represent electrons programmed and stored in the floating gate of each cell.

FIG. 5 is a cross-sectional view of a NAND array, illustrating BTBT or GIDL enhanced by high electric field present in the conventional EASB program inhibit operation of FIG. 4. Circles with negative signs represent electrons programmed and stored in the floating gate of each cell.

FIG. 7B is an enlarged view of a portion of the isolation cell in the array of FIG. 7A. Circles with negative signs represent electrons programmed and stored in the floating gate of each cell.

FIG. 8 is a table describing one example of applied voltage for each program selected word line in case of a 16 word line NAND string to illustrate another embodiment of the invention. This embodiment assumes that programming sequence is from source side to drain side word lines, and each row indicates selected word line number for programming, and each column indicates the voltage applied to each word line. Viso stands for isolation voltage, Vpgm for program voltage and Vpass for an intermediate voltage for boosting the channel regions of cell strings to be inhibited to reduce program disturb.

FIG. 9 is a table describing another example of applied voltage for each program selected word line in case of a 16 word line NAND string to illustrate still another embodiment of the invention. This embodiment assumes that programming sequence is from source side to drain side word lines, and each row indicates selected word line number for programming, and each column indicates the voltage applied to each word line. In this example Viso is shifted by one word line towards the drain side select gate per each shifting of 2 word lines for the selected word line. Viso stands for isolation voltage, Vpgm for program voltage and Vpass for an intermediate voltage for boosting the channel regions of cell strings to be inhibited to reduce program disturb.

For simplicity in description, identical components are labeled by the same numerals in this application.

DETAILED DESCRIPTION OF EXEMPLARY EMBODIMENTS

Memory System

Figure 1:
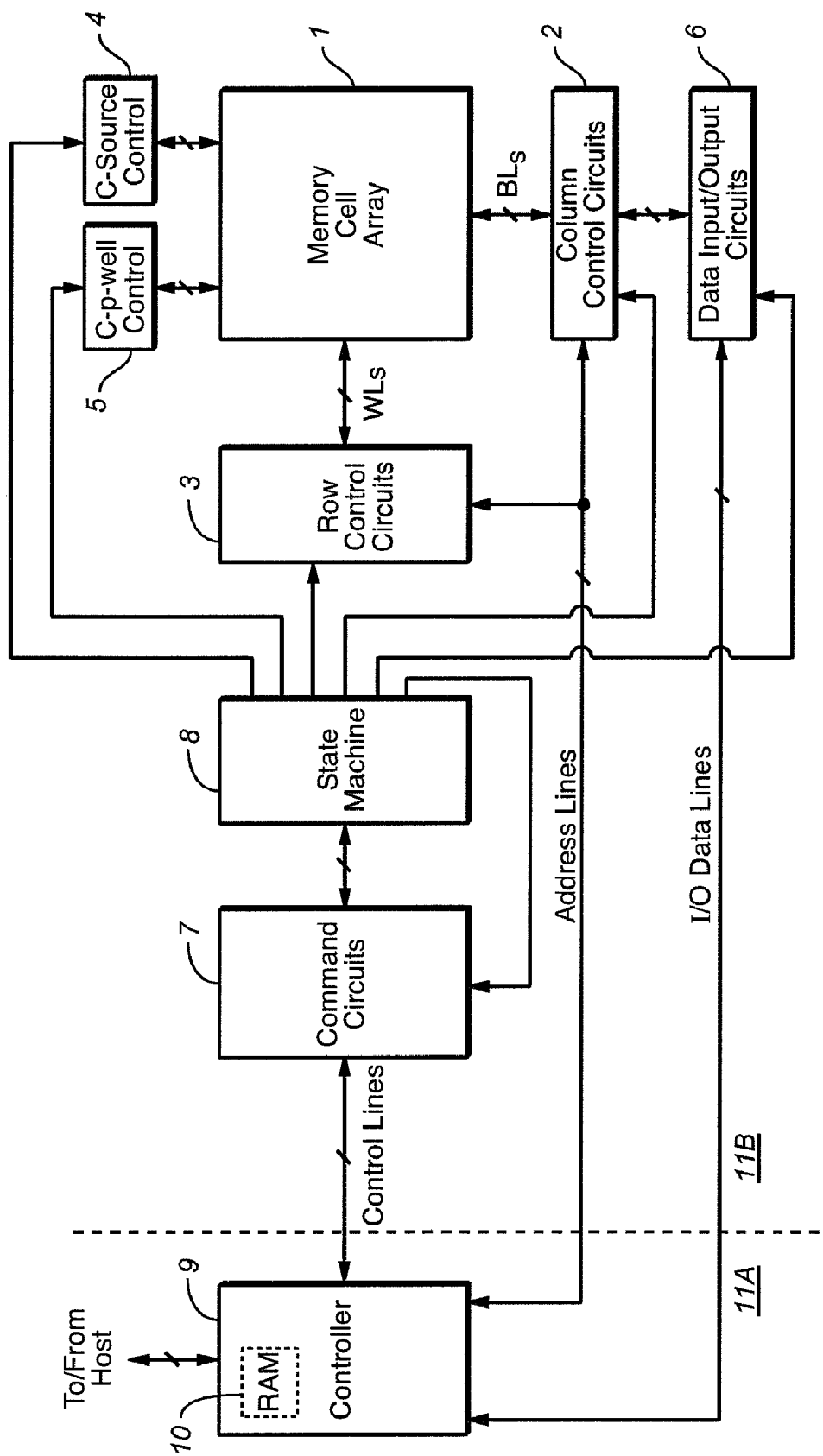
FIG. 1 is the block diagram of a type of memory system in which the memory cell array and operational improvement of the present invention may be implemented.

An example memory system in which the various aspects of the present invention may be implemented is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type that is described above in the Background and in references incorporated herein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control Circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region (cell P-well) on which the memory cells (M) are formed. The c-source control circuit 4 controls a common source line connected to the memory cells (M). The c-p-well control circuit 5 controls the cell P-well voltage.

The data stored in the memory cells (M) are read out by the column control circuit 2 and are output to external I/O lines via an I/O line and a data input/output buffer 6. Program data to be stored in the memory cells are input to the data input-output buffer 6 via the external I/O lines, and transferred to the column control circuit 2. The external I/O lines are connected to a controller 9. The controller 9 includes various types of registers and other memory including a volatile random-access-memory (RAM) 10.

Command data for controlling the flash memory device are inputted to command circuits 7 connected to external control lines that are connected with the controller 9. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 9 is connected or connectable with a host system such as a personal computer, a digital camera, a game controller, a cellular phone, a media player such as a MP3 player, or a personal digital assistant. It is the host that initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 11A that includes the controller 9, and one or more integrated circuit chips 11B that each contains a memory array and associated control, input/output and state machine circuits. It is possible to integrate the memory array and controller circuits of a system together on one or more integrated circuit chips.

The memory system of FIG. 1 may be embedded as part of the host system, or may be included in a memory card that is removably insertable into a mating socket of a host system. Such a card may include the entire memory system, or the controller and memory array, with associated peripheral circuits, may be provided in separate cards. Several card implementations are described, for example, in U.S. Pat. No. 5,887, 145, which patent is expressly incorporated herein in its entirety by this reference.

Figure 6:
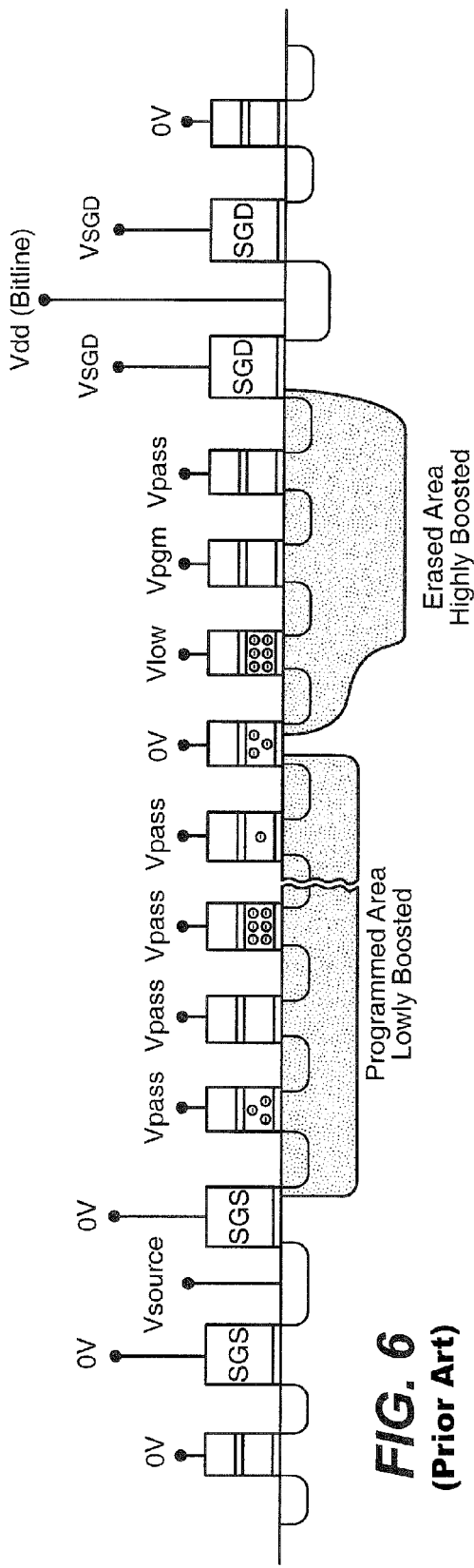
FIG. 6 is a cross-sectional view of a NAND array, illustrating a modified EASB program inhibit operation described in U.S. patent application Publication No. 2005/0174852 A1, published Aug. 11, 2005, Ser. No. 10/774,014, filed Feb. 6, 2004 by Gerrit Jan Hemink; this Publication is incorporated herein by reference. Intermediate voltage Vlow is applied to the source side neighbor of the word line at Vpgm, and isolation voltage is applied to the source side neighbor of the word line at Vlow. Circles with negative sign represent electrons programmed and stored in the floating gate of each cell.

FIG. 6 illustrates the modified EASB program inhibit operation of U.S. patent application Publication No. 2005/0174852 A1. The major difference between the operation in FIG. 6 and that of the EASB method in FIG. 4 is that the isolation voltage is not applied to the adjacent word line of the selected Vpgm word line, to thereby suppress the high vertical field under the drain edge of the isolation cell. Instead intermediate voltage Vlow (0V<Vlow<Vpgm) is applied to the source side neighbor of the selected Vpgm word line, followed by an isolation voltage being applied to the source side neighbor of the word line to which Vlow is applied.

While the modified EASB method in FIG. 6 is successful in reducing the high electric fields in the neighborhood of the isolation cell to suppress program disturb, it may be desirable to further suppress the electric field increase during drain side word line programming, especially in scaled NAND devices.

Figure 7A:
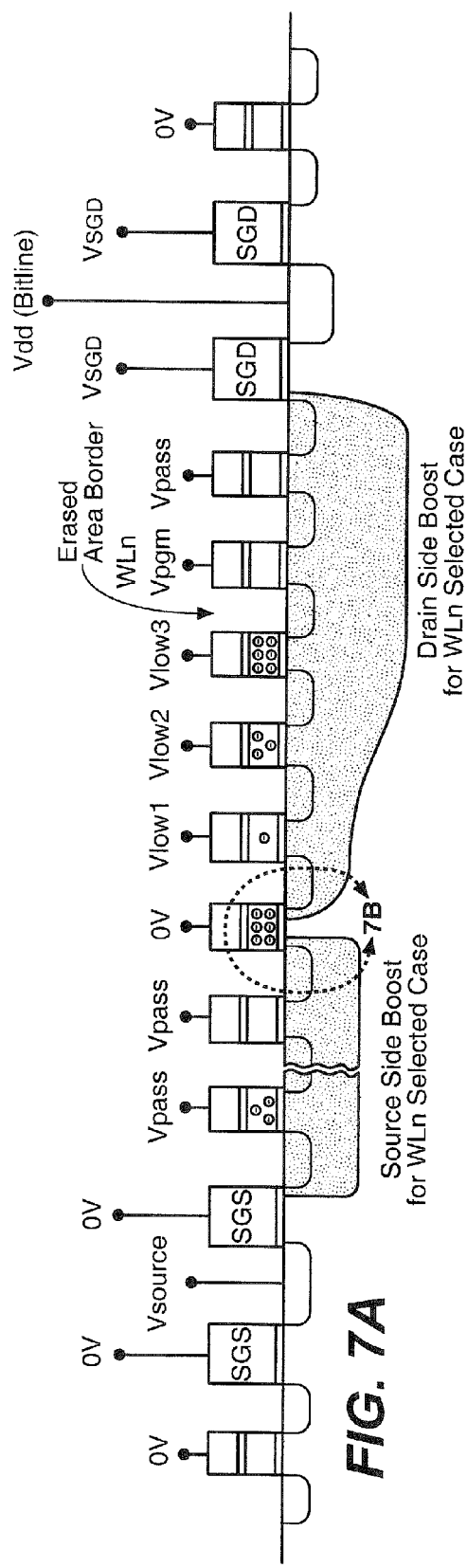
FIG. 7A is a cross-sectional view of a NAND array, illustrating one embodiment of the invention where the isolation word line is placed away from selected word line at Vpgm.

FIG. 7A is a cross-sectional view of a NAND array, illustrating one embodiment of the invention where the isolation word line is placed away from the selected word line with program voltage Vpgm applied to it. FIG. 7B is an enlarged view of a portion of the isolation cell controlled by the isolation word line in the array of FIG. 7A. Circles with negative signs represent electrons programmed and stored in the floating gate of each cell.

As illustrated in FIGS. 7A and 7B, an isolation low voltage (typically 0V) is applied to a word line farther away from the selected or Vpgm word line and intermediate voltages are applied to several word lines in between isolation and Vpgm word lines, as compared to the conventional EASB or the modified EASB schemes of FIGS. 4-6. The effect is illustrated by a smaller shaded area underneath the word lines to which intermediate voltages (Vlow1, Vlow2, Vlow3) are applied, indicating that the channel areas underneath such word lines are either not boosted or boosted to lower potentials than would be the case in the conventional EASB or the modified EASB operations shown in FIGS. 4-6. Hence, occurrence of high electric field at the isolation cell (controlled by the isolation word line) is suppressed compared to the conventional EASB or the modified EASB operations. Furthermore, the isolated drain side channel now contains cells which may have been programmed in previous programming sequences, so the boosting of drain side channel by the program voltage Vpgm is moderately reduced and the dominant influence of Vpgm boosting is relaxed.

In the EASB or modified EASB types of boosting methods of FIGS. 4-6, the isolation word line follows the selected word line in lock step fashion, so that as the selected word line advances towards the drain side select gate by one word line, the isolation word line will also be advanced towards the drain side select gate by one word line. In other words, the border between the isolated channel regions or areas at the isolation cell is determined by the position of the selected word line.

It should be noted that in the scheme of FIGS. 7A and 7B, the above is no longer necessarily the case, so that the border between the isolated channel regions or areas can be determined in a manner some what independently of the position of the selected word line. The number of word lines in between the isolation and selected word line can be chosen in any manner to reduce the high vertical and lateral electric fields. Moreover, any voltages can be applied to such word lines for the same purpose. Preferably, the applied voltages on the intermediate word lines are high enough to keep the drain side boosted NAND string channel conductive, but not too high to create extremely high electric fields at any cells within the NAND string. So, it is important to change the boosting channel length between the isolation word line and the selected word line to which Vpgm is applied, depending on how close the selected word line is to the drain side select gate. In other words, the optimum position of the isolation word line should be defined so that high electrical field differences will not occur at the isolation cell (controlled by the isolation word line) even at the most extreme situation (such as in programming cells next to or very close to the drain side select gate). Preferably the isolation voltage is at or around 0V. Vlow1, Vlow2 and Vlow3 are preferably in a range of 3V to a voltage lower than Vpass. Vpass is preferably in a range of 7~11V, and the program voltage Vpgm preferably in a range of 16~25V. Where it may be desirable for the voltages applied to the word lines between the selected and isolation word lines to have some boosting effect on the channel regions, Vlow1, Vlow2 and Vlow3 are preferably in a range of 3V to Vpgm.

FIG. 8 is a table describing one example of applied voltages to the word lines for each selected word line in case of 16 word lines (WL0 to WL15) NAND string to illustrate another embodiment of the invention. This embodiment assumes that programming sequence is from source side to drain side word lines, so that the programming begins by selecting word line WL0, then WL1, WL2 and so sequentially until WL15 is selected, in one programming cycle. In the table, each row indicates the word line selected for programming (i.e. by applying Vpgm to the selected word line), and the entries in such row and in the 16 columns indicate the voltages applied to all 16 word lines when such word line in the row is selected. For example, the fifth row 102 labeled "WL4" in the table on the left side means the word line WL4 is selected for programming. The entries of such row in the table include the entry "Vpass" in the columns under "WL0" and "WL1," "Viso" in the column under "WL2," "Vlow" in the column under "WL3," "Vpgm" in the column under "WL4," and "Vpass" in the columns under "WL5" through "WL15." This means that when the word line WL4 is selected for programming in the programming cycle, Vpass is applied to word lines WL0 and WL1, the isolation voltage Viso to WL2, the program voltage Vpgm to the selected word line WL4, and Vpass to WL5 through WL15. Similarly, each of the other rows in the table of FIG. 8 contains entries of the different voltages applied to the 16 word lines when one of the remaining 15 word lines is selected for programming. In FIG. 8, Viso stands for isolation voltage, Vpgm for program voltage and Vpass for an intermediate voltage for boosting the channel regions of cell strings to be inhibited to reduce program disturb.

FIG. 8 is an example of applied voltages for each word line in one embodiment. The table in FIG. 8 assumes that the programming sequence follows the basic rule of NAND flash programming, meaning programming is performed from source side to drain side word lines. In this example the modified EASB method illustrated in FIG. 6 is used for programming word line WL0 to WL11, but the channel isolation voltage, typically 0V (Viso) is fixed at word line 9 for the rest (i.e. when programming word lines WL12-WL15) of the drain side word line programming. In other words, the channel isolation voltage is applied to word line 9, or WL9, when programming word lines WL12-WL15. This can suppress the program disturb enhanced by various types of high electric fields at the isolation cell (controlled by the isolation word line) during high word line programming.

FIG. 9 is a table describing another example of applied voltages for each program selected word line in case of a 16 word line NAND string to illustrate still another embodiment of the invention. As in FIG. 8, in the table of FIG. 9, each row indicates the word line selected for programming (i.e. by applying Vpgm to the selected word line), and the entries in such row and in the 16 columns indicate the voltages applied to all 16 word lines when such word line in the row is selected. In this example Viso is shifted by one word line towards the drain side select gate per each shifting of 2 word lines for the selected word line when programming word lines WL7-WL15, but the modified EASB scheme of FIG. 6 is followed when programming word lines WL0-WL6. Viso stands for isolation voltage, Vpgm for program voltage and Vpass for an intermediate voltage for boosting the channel regions of cell strings to be inhibited to reduce program disturb.

FIG. 9 is a robust example of a high electric field protection boosting scheme, but now Viso is shifting gradually and at a slower rate to the higher number word line so that drain side boosting would not become too low. Because once the boosting of the channel under the Vpgm becomes too low, then the cell(s) near the isolation word line cannot withstand the Vpgm stress and will be program disturbed. The program disturb enhanced by the high electric field near the isolation word line will not occur if Viso is far enough away from the selected Vpgm word line.

While in the embodiment of FIG. 9, the word line to which the isolation voltage is applied is shifted by one word line towards the drain side select gate when the selected word line is shifted by two word lines, it is possible to cause the isolation word line (controlling the isolation cell) to be shifted by one word line towards the drain side select gate when the selected word line is shifted by a number of word lines that is different from two. In general, the isolation word line is shifted by one word line towards the drain side select gate when the selected word line is shifted by n word lines, where n is an integer greater than 1. The shifting of the isolation voltage can be continual or intermittent. For some applications, it may be desirable to construct a regular or irregular pattern of shifting that is yet different from the above. For example, in one possible regular pattern, as long as the isolation word line remains to be on the source side of the selected word line, the isolation word line may be shifted by m word lines towards the drain side select gate when the selected word line is shifted by p word lines, where m and p are 0 or positive integers.

In the embodiment of FIG. 8, the modified EASB programming scheme of FIG. 6 is used until the word lines selected are closer to the drain side select gate than to the source side select gate, or closer to the bit line than to the source line. Thus, in FIG. 8, this scheme is followed until word line WL9 is selected, at which point the isolation voltage becomes stationary. In FIG. 9, this modified EASB programming scheme is followed until word line WL7 is selected, at which point the isolation voltage shifts by one word line when the selected word line is shifted by two word lines. Thus, in the embodiments of both FIGS. 8 and 9, the modified EASB programming scheme of FIG. 6 is used until the word lines selected for programming reaches a predetermined position relative to the drain and source side select gates, at which point the isolation voltage either becomes stationary, or starts to shift at a lower rate than the selected word line. Preferably this predetermined position is at a distance from the drain side select gate that is not more than about 15% of the distance between the drain and source side select gates, or at a distance from the bit line that is not more than about 15% the distance between the bit and source lines.

While in the embodiment of FIG. 8, the isolation word line becomes stationary at WL9, substantially the same advantages can be obtained when the isolation word line (controlling the isolation cell) is not entirely stationary, such as by selecting alternately (toggling) between WL8 and WL9, or between WL9 and WL10, as the isolation word line, when the selected word line is shifted by one word line. The toggling also can take on an irregular pattern instead. Such and other variations are within the scope of the invention. While the modified EASB scheme of FIG. 6 is used in the embodiments of FIGS. 8 and 9, the unmodified scheme of FIGS. 4 and 5 may be used instead, as well as other different variations of EASB schemes, until the selected word line reaches a predetermined position as described above. In all such schemes, the number of word lines separating the isolation and selected word lines, if any, remains substantially constant when programming from the source side to the predetermined position.

The problem sought to be overcome is the high vertical and lateral electric fields in the channel regions at or close to the isolation cell. Such fields can be reduced by separating the isolation word line (controlling the isolation cell) and the selected word line by two or more word lines in still another embodiment of the invention. This can be done when the selected word line is closer to the drain side select gate, as well as at other instances. However, preferably and in combination with the above feature, the number of word lines separating the isolation word line and the selected word line is also adjusted for further reducing such fields, such as in the manner described above. Any voltages can be applied to word lines separating the isolation word line and the selected word line for reducing such fields. Preferably, the applied voltages on the intermediate word lines are high enough to keep the drain side boosted NAND string channel conductive, but not too high to create extremely high electric fields at any cells within the NAND string. For example, voltages in the range of about 3V up to Vpass or 3V up to a voltage lower than Vpass may be applied to one or more of the word lines separating the isolation word line and the selected word line. If it is desired to boost the potentials of the channel regions underneath such word lines, the voltages applied may be in the range of about 3V up to the program voltage Vpgm. Preferably the one or more of the word lines separating the isolation word line and the selected word line is closer to the drain side select gate than to the source side select gate, and thus closer to the bit line than to the source line. In one embodiment, the one or more of the word lines separating the isolation and the selected word lines is not more than about 15% of the distance between the bit and source lines.

As noted above, where the isolation word line also shifts towards the bit line when the programming progresses towards to the bit line, and is close to the bit line, there may be inadequate boosting of the drain side channel region in the transistor string to be inhibited between the isolation word line and the drain side select gate. This is especially the case where the transistors between the isolation word line and the selected word line have been programmed so that they have negative charges on their floating gates, thereby rendering the boosting of their channel regions less effective. This compounds the effect of the shorter drain side channel length. This would be the case, for example, where the distance between the isolation word line and the bit line (or drain side select gate) is not more than 15% distance between the drain and source side select gates. In such event, it may be preferred to apply higher voltages than Vpass to the word lines separating the isolation and selected word lines. Thus, as illustrated in FIG. 9, boosting voltages such as Vhi1, Vhi2, Vhi3, Vhi4 or Vhi5 may be applied to the word lines separating the isolation and selected word lines. The voltage ranges of such boosting voltages may be such that Vpass<Vhi1<Vhi2<Vhi3<Vhi4<Vhi5<Vpgm in this particular case. It will be noted from FIG. 9 that, as the selected word line programming approaches the drain side select gate, and as the drain side channel region becomes shorter and shorter, higher and higher voltages (Vhi1 to Vhi2 to Vhi3 to Vhi4 to Vhi5) are applied to the word lines separating the isolation and selected word lines to compensate for continually reduced boosting, which in turn is caused by the continually reduced length of the drain side channel region. The main purpose to use higher voltages than Vpass in this case is to improve the boosting efficiency of the drain side channel. Obviously higher (or lower) boosting voltages other than those in such example may be used and are within the scope of the invention.

In the embodiments above, the scheme described generally adopts the process where memory cells are programmed in a specified order with the cells closest to the source side select gate being programmed first, and sequentially programmed to the cells closest to the drain side select gate in the programming cycle. This, however, is not required, and substantially the same advantages can be obtained by adjusting the separation between the selected and isolation word lines, and/or by separating the selected and isolation word lines by two or more word lines, in the manner described above, even where such source side select gate to drain side select gate programming sequence is not followed.

While the invention has been described above by reference to various embodiments, it will be understood that changes and modifications may be made without departing from the scope of the invention, which is to be defined only by the appended claims and their equivalent. All references referred to herein are incorporated herein by reference.

What is claimed is:

1. An apparatus for programming a memory system, said system comprising strings of charge storage transistors for storing different charge states, said strings including a first and a second string each connected between one of a plurality of bit lines and a source line and controlled by common word lines, said apparatus comprising:
    a circuit programming the system by applying a program voltage to the word lines, one selected word line at a time, to program all of the transistors in the first string;
    said circuit coupling, during the programming, first boosting voltage level(s) to at least some of the transistors in the second string between said selected word line and said one bit line connected to the second string to boost electrical potential(s) of channel regions of transistors in the second string to a value or values closer to the program voltage to reduce program disturb; and
    said circuit coupling, during the programming, a second voltage level that is less than the first voltage level(s) to at least one isolation charge storage transistor having a source and drain in the second string between the selected word line and the source line, said second voltage level being such that a first channel area of the second string on the source side of the at least one isolation transistor is electrically isolated from a second channel area of the second string on the drain side of the at least one isolation transistor, so that the at least one isolation transistor is at a plurality of positions separated from the selected word line during the programming;
    wherein when the selected word line is at a first position at a first distance from said one bit line and at a second position at a second distance smaller than the first distance from said one bit line at two different times, the coupling is such that the position of the at least one isolation transistor is separated from the second position by a larger number of word lines than from the first position, to reduce program disturb, and such that the position of the at least one isolation transistor is separated from the first and second positions by at least one word line.

2. The apparatus of claim 1, wherein the second position is closer to the one bit line than to the source line.

3. The apparatus of claim 1, wherein the second distance is not more than about 15% of a distance between the source line and said one bit line.

4. The apparatus of claim 1, wherein the circuit programs the system by applying the program voltage to the word lines sequentially from the word lines located near the source line to those located near said one bit line, so that the selected word line is at positions at decreasing distances from said one bit line as the programming progresses.

5. The apparatus of claim 4, wherein position of the at least one isolation transistor is substantially stationary when the programming applies the program voltage sequentially to the word lines located between such bit line and a predetermined location between the source line and said one bit line.

6. The apparatus of claim 5, wherein the predetermined location is at a distance from said one bit line that is not more than about 15% of a distance between the source line and said one bit line.

7. The apparatus of claim 1, wherein the circuit programs the system by applying the program voltage to the word lines sequentially from the word lines located near the source line to those located near said one bit line, so that the selected word line is at positions at decreasing distances from said one bit line as the programming progresses, and wherein position of the at least one isolation transistor is not stationary when the programming applies the program voltage sequentially to the word lines located between the one bit line and the predetermined location.

8. The apparatus of claim 7, wherein position of the at least one isolation transistor moves towards the one bit line by one word line when the selected word line moves towards the one bit line by every one word line when the programming applies the program voltage sequentially to the word lines located between the source line and the predetermined location.

9. The apparatus of claim 1, wherein the circuit programs the system by applying the program voltage to the word lines sequentially from the word lines located near the source line to those located near said one bit line, so that the selected word line is at positions at decreasing distances from said one bit line as the programming progresses, and wherein position of the isolation transistor moves towards the one bit line by one word line when the selected word line moves towards the one bit line by every n word lines when the programming applies the program voltage sequentially to the word lines located between said one bit line and a predetermined location between the source line and said one bit line, n being a positive integer greater than 1.

10. The apparatus of claim 9, wherein the predetermined location is at a distance from said one bit line that is not more than about 15% of a distance between the source line and said one bit line.

11. The apparatus of claim 1, wherein the at least one isolation transistor is at position(s) separated from the selected word line by at least one separation word line when the programming applies the program voltage sequentially to the word lines.

12. The apparatus of claim 11, wherein the circuit couples third voltage level(s) to the at least one separation word line, wherein the third voltage level(s) is such that a portion of the second channel area extending between the isolation transistor and the selected word line remains electrically conductive, and such that the electrical potential of a channel region of such portion is not boosted.

13. The apparatus of claim 12, wherein at least one of the third voltage level is between about 3V and said first boosting voltage level(s).

14. The apparatus of claim 11, wherein the circuit couples at least one of the third voltage level(s) to at least one separation word line, wherein the at least one third voltage level(s) is such that electrical potential(s) of a portion of the second channel area extending between the isolation transistor and the selected word line is boosted to a value or values closer to the program voltage to reduce program disturb.

15. The apparatus of claim 14, wherein at least one of the third voltage level is between about 3V and said program voltage.

16. The apparatus of claim 1, wherein the circuit programs the system by applying the program voltage to the word lines sequentially from the word lines located near the source line to those located near said one bit line, so that the selected word line is at positions at decreasing distances from said one bit line as the programming progresses, and wherein the number of word lines separating the isolation transistor and the selected word line increases as the programming progresses towards said one bit line from a predetermined location between the source line and said one bit line.

17. The apparatus of claim 16, wherein the number of word lines separating the isolation transistor and the selected word line, if any, remains substantially constant as the programming progresses from word lines adjacent to the source line to said predetermined location.

18. The apparatus of claim 16, wherein the predetermined location is at a distance from said one bit line that is not more than about 15% of a distance between the source line and said one bit line.

* * * * *